US012566383B2

(12) United States Patent
Schepis

(10) Patent No.: US 12,566,383 B2
(45) Date of Patent: Mar. 3, 2026

(54) NON-DESTRUCTIVE COUPON GENERATION VIA DIRECT WRITE LITHOGRAPHY FOR SEMICONDUCTOR PROCESS DEVELOPMENT

(71) Applicant: Tokyo Electron Limited, Minato-ku (JP)

(72) Inventor: Anthony R. Schepis, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 528 days.

(21) Appl. No.: 17/463,060

(22) Filed: Aug. 31, 2021

(65) Prior Publication Data

US 2022/0113635 A1 Apr. 14, 2022

Related U.S. Application Data

(60) Provisional application No. 63/089,116, filed on Oct. 8, 2020.

(51) Int. Cl.
*G03F 7/00* (2006.01)
*H01L 21/027* (2006.01)

(52) U.S. Cl.
CPC ...... *G03F 7/70383* (2013.01); *H01L 21/0274* (2013.01); *G03F 7/70491* (2013.01)

(58) Field of Classification Search
CPC ............. G03F 7/70383; G03F 7/70491; H01L 21/0274; H01L 22/10
See application file for complete search history.

(56) References Cited

U.S. PATENT DOCUMENTS

2003/0194647 A1* 10/2003 Huang ..................... G03F 7/405
                                                     430/296
2008/0073570 A1*  3/2008 Chen ....................... H01L 22/12
                                                     250/492.1
2008/0087844 A1*  4/2008 Nunan ..................... H01L 22/20
                                                     257/E21.525
2009/0162790 A1*  6/2009 Romano ................... G03F 7/40
                                                     430/311

(Continued)

OTHER PUBLICATIONS https://semiengineering.com/in-cell-overlay-metrology-by-using-optical-metrology-tool/In-Cell Overlay Metrology By Using Optical Metrology Tool, published 2018 (Year: 2018).*

(Continued)

*Primary Examiner* — Jonathan Johnson
*Assistant Examiner* — Alexander N. Lee
(74) *Attorney, Agent, or Firm* — Slater Matsil, LLP

(57) ABSTRACT

A method of processing a substrate that includes: depositing a photoresist layer over the substrate; performing a cyclic direct-write lithographic process using a direct-write lithography tool, the cyclic direct-write lithographic process including a plurality of cycles, each of the plurality of cycles including: exposing the photoresist layer to a patterned actinic radiation without using a photomask, defining one of a plurality of coupon regions, where the plurality of coupon regions are configured to generate a plurality of test samples on the substrate for evaluating process conditions of a fabrication process; exposing the one of the plurality of coupon regions; and performing the fabrication process on the one of the plurality of coupon regions.

20 Claims, 10 Drawing Sheets

(56)  References Cited

U.S. PATENT DOCUMENTS

| | | | | |
|---|---|---|---|---|
| 2012/0128942 A1* | 5/2012 | Dunn | ........................ | G03F 7/40 |
| | | | | 428/156 |
| 2014/0117488 A1* | 5/2014 | Wallace | .............. | H01L 21/2633 |
| | | | | 438/694 |
| 2017/0330806 A1* | 11/2017 | deVilliers | ........... | G03F 7/70558 |
| 2017/0357155 A1* | 12/2017 | Quintanilha | .......... | G03F 7/2004 |
| 2022/0238392 A1* | 7/2022 | Wang | .................. | H01L 21/0274 |

OTHER PUBLICATIONS https://spectrum.ieee.org/seeing-double "Seeing Double", published 2008 (Year: 2008).*
Flack W, Hsieh R, Kenyon G, Nguyen K, Ranjan M, Silva N, Cardoso P, Toole E, Leuschner R, Robl W, Meyer T, "Lithography technique to reduce the alignment errors from die placement in fan-out wafer level packaging applications", Proceedings—Electronic Components and Technology Conference, 65-70 (Year: 2011).*

* cited by examiner

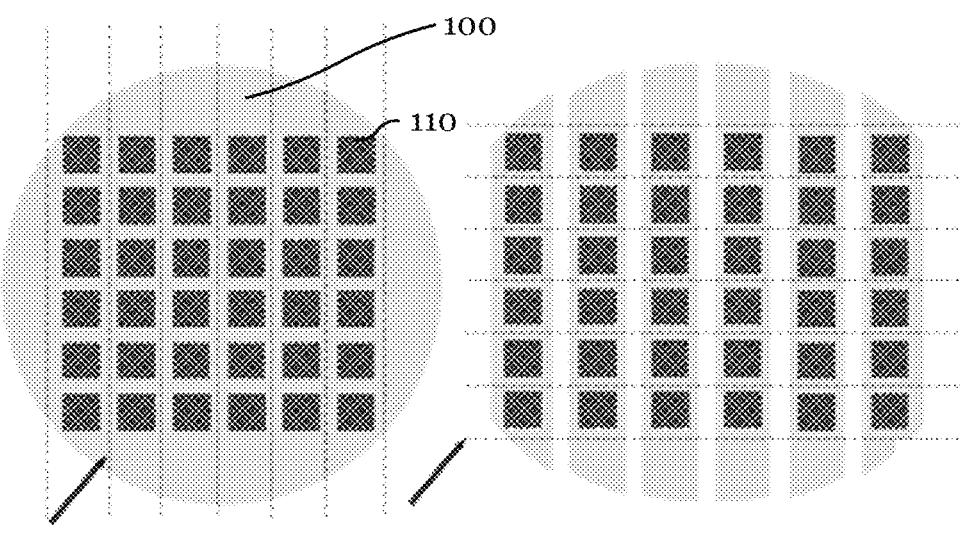
FIG. 1A
(PRIOR ART)
FIG. 1B
(PRIOR ART)
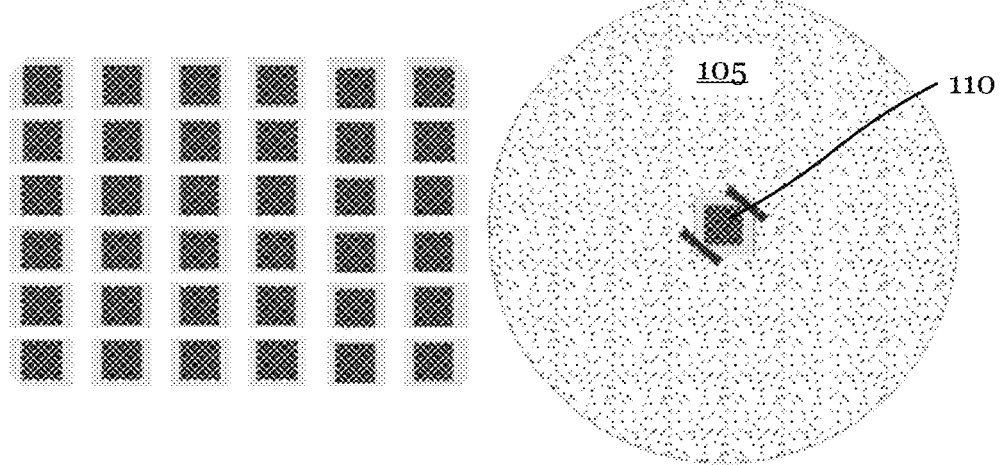
FIG. 1C
(PRIOR ART)
FIG. 1D
(PRIOR ART)

FIG. 3A                    FIG. 3B                    FIG. 3C

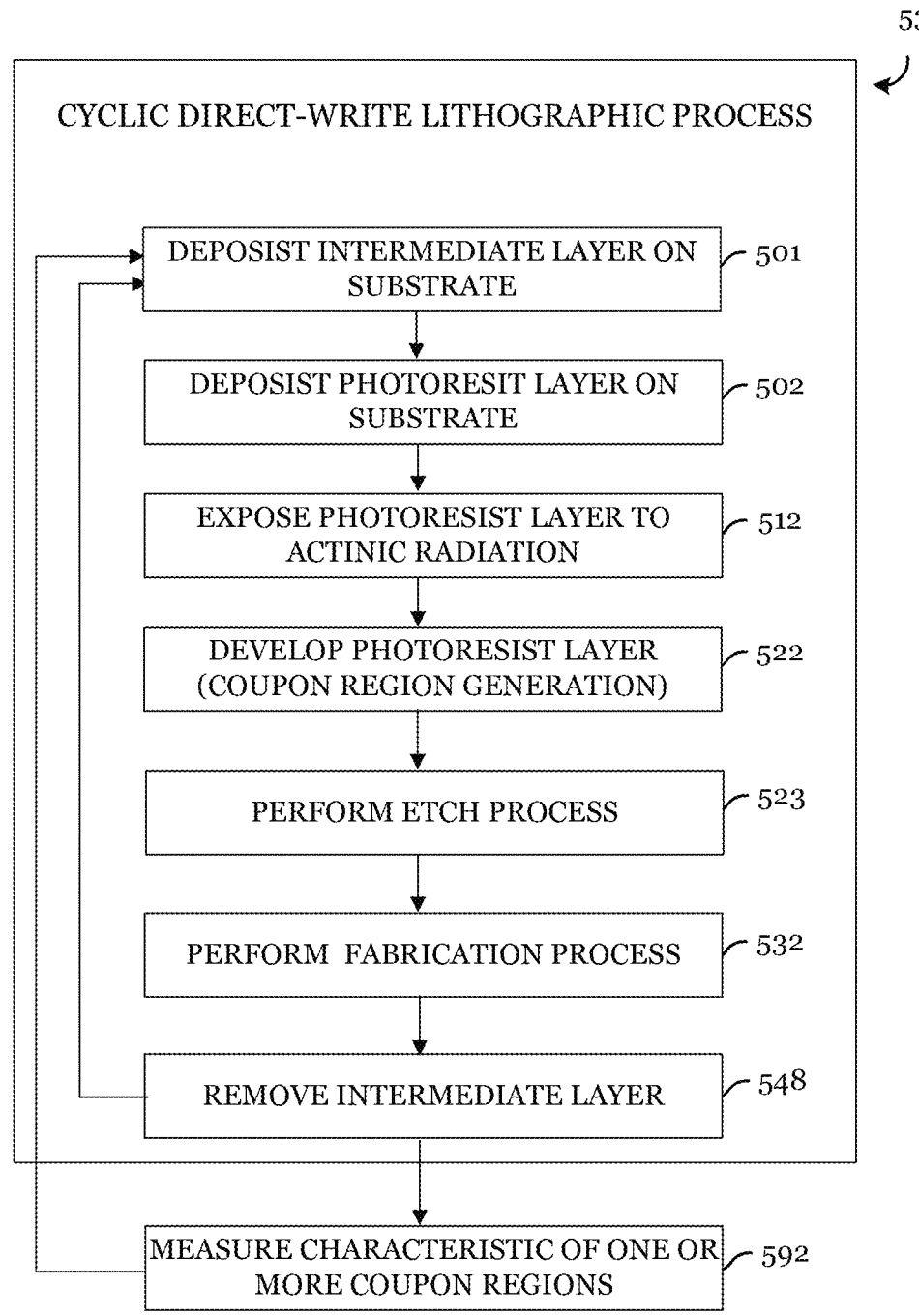

53

CYCLIC DIRECT-WRITE LITHOGRAPHIC PROCESS

DEPOSIST INTERMEDIATE LAYER ON SUBSTRATE — 501

DEPOSIST PHOTORESIT LAYER ON SUBSTRATE — 502

EXPOSE PHOTORESIST LAYER TO ACTINIC RADIATION — 512

DEVELOP PHOTORESIST LAYER (COUPON REGION GENERATION) — 522

PERFORM ETCH PROCESS — 523

PERFORM FABRICATION PROCESS — 532

REMOVE INTERMEDIATE LAYER — 548

MEASURE CHARACTERISTIC OF ONE OR MORE COUPON REGIONS — 592

FIG. 5C

NON-DESTRUCTIVE COUPON GENERATION VIA DIRECT WRITE LITHOGRAPHY FOR SEMICONDUCTOR PROCESS DEVELOPMENT

CROSS-REFERENCE TO RELATED APPLICATIONS

This application claims the benefit of U.S. Provisional Application No. 63/089,116, filed on Oct. 8, 2020, which application is hereby incorporated herein by reference.

TECHNICAL FIELD

The present invention relates generally to a method of processing a substrate, and, in particular embodiments, to a method for non-destructive coupon generation.

BACKGROUND

Semiconductor device fabrication includes many different steps of photolithography, material deposition, etching, and annealing, among other, to produce an integrated circuit. Typical integration schemes involve seventy or more levels to a design. Each level includes multiple unit process steps. During the development phase of a new design and/or technology node, it is common for each one of the unit process steps to undergo optimization to improve feature fidelity and yield.

Unit process optimization can be a daunting task as each step has a multitude of settings that require adjustment. For instance, in the case of a reactive ion etch (RIE), the setting may comprise a combination of process gases requiring down selection with respective flow rate, top/bottom plasma power, and total etch time. All of these settings are a function of the pattern loading (density, geometry et cetera). This type of optimization is typically executed on each of the 70+ levels of a design.

SUMMARY

In accordance with an embodiment of the present invention, a method of processing a substrate including: coating a substrate with a first masking film including a first photoresist; executing a first direct-write exposure process of a first patterned actinic radiation on the first masking film, the first patterned actinic radiation creating a first latent pattern that defines a first coupon region on the substrate; developing the first masking film resulting in a first topographic masking film with the first coupon region uncovered; executing a first fabrication process step on the first coupon region; measuring a characteristic of the first coupon region; coating the substrate with a second masking film including a second photoresist; executing a second direct-write exposure process of a second patterned actinic radiation on the second masking film, the second patterned actinic radiation creating a second latent pattern that defines a second coupon region on the substrate; developing the second masking film resulting in a second topographic masking film with the second coupon region uncovered; executing a second fabrication process step on the second coupon region; and measuring a characteristic of the second coupon region.

In accordance with an embodiment of the present invention, a method of processing a substrate that includes: depositing a photoresist layer over the substrate; performing a cyclic direct-write lithographic process using a direct-write lithography tool, the cyclic direct-write lithographic process including a plurality of cycles, each of the plurality of cycles including: exposing the photoresist layer to a patterned actinic radiation without using a photomask, defining one of a plurality of coupon regions, where the plurality of coupon regions are configured to generate a plurality of test samples on the substrate for evaluating process conditions of a fabrication process; exposing the one of the plurality of coupon regions; and performing the fabrication process on the one of the plurality of coupon regions.

In accordance with an embodiment of the present invention, a non-destructive coupon hardware system that includes: a track configured to support a substrate during a deposition or developing process, the track being coupled to a direct write lithography tool; and one or more microprocessors configured to execute programs to: create a digital map that partitions a portion of the substrate into a plurality of coupon regions, deposit a photoresist layer over the substrate supported on the track, expose the photoresist layer on the track based on the digital map using the direct write lithography tool, and develop the exposed photoresist layer to open a coupon region for further processing.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate a conventional couponing method, wherein FIG. 1A illustrates separating a substrate into vertical arrays of individual dies, FIG. 1B illustrates further separating the substrate into individual dies, FIG. 1C illustrate resulting individual coupons/dies, and FIG. 1D illustrates an individual coupon attached to a carrier wafer;

FIGS. 3A-3D illustrate process steps of non-destructive coupon generation in accordance with various embodiments, wherein FIG. 3A illustrates a wafer coated with a positive tone photoresist, FIG. 3B illustrates a direct-write lithography tool that projects a first pattern on the wafer, FIG. 3C illustrates a resulting coupon region on the wafer after development, and FIG. 3D illustrates an enlarged schematic of the coupon region of FIG. 3C;

FIGS. 3E and 3F illustrate examples of a coupon region comprising a plurality of individual dies, wherein FIG. 3E illustrates a coupon region comprising a matrix of 2×2 individual dies, and FIG. 3F illustrates a coupon region comprising a line (1×6) of individual dies;

FIGS. 4A-4C illustrate process steps of a subsequent direct-write lithographic process of non-destructive coupon generation in accordance with various embodiments, wherein FIG. 4A illustrates a wafer re-coated with a positive tone photoresist, FIG. 4B illustrates a direct-write lithography tool that projects a second pattern on the wafer, and FIG. 4C illustrates a resulting coupon region on the wafer after development;

FIGS. 5A-5E illustrate process flow diagrams of non-destructive coupon generation in accordance with various embodiments, wherein FIG. 5A illustrates an embodiment, wherein FIG. 5B illustrates another embodiment describing a cyclic direct-write lithographic process, FIG. 5C illustrates an alternate embodiment using an intermediate layer, FIG. 5D illustrates yet another embodiment including generating a digital map, and FIG. 5E illustrates another embodiment where only one photoresist layer is used without reapplying for cycles of coupon region generation.

DETAILED DESCRIPTION OF ILLUSTRATIVE EMBODIMENTS

Figures 2A, 2B:
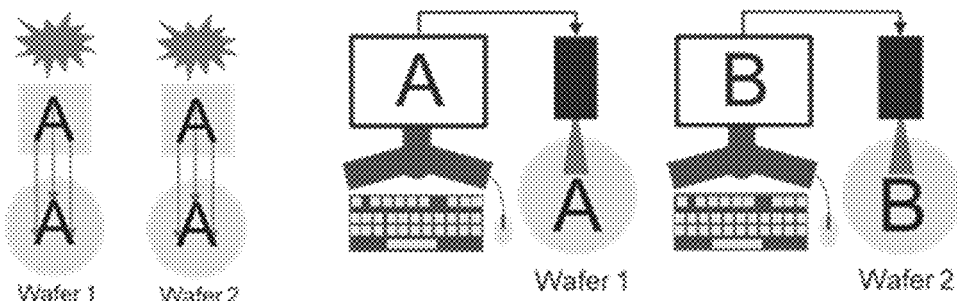
FIG. 2A illustrates a schematic of conventional mask-based lithography.
FIG. 2B illustrates a schematic of direct-write lithography in accordance with an embodiment.

Techniques herein provide a pseudo couponing of semiconductor wafers by leveraging a direct-write system to selectively open areas on a wafer for unit process optimization.

A wafer used for semiconductor manufacturing is typically used to fabricate multiple integrated circuits or other chips. Depending on size of the wafer and die size, anywhere from several to hundreds of dies can be fit on a given silicon wafer. Usually a device design is repeated on each die for processing efficiency. To improve the efficiency of unit process development, it is common for process engineers to cleave the wafer to gain access to individual die. This is known as couponing. An individual wafer segment or separated die is referred to as a coupon. Couponing results in multiple test samples to evaluate process conditions rather than only having one wafer for testing. Unfortunately, while couponing is efficient, this process is destructive. Moreover, this process generates particles in a clean room environment and can be prohibitive to inspecting the process optimization results on sensitive metrology equipment.

Techniques herein, however, provide a method for non-destructive couponing. Direct-write imaging/lithography is used to selectively access a given coupon while other coupons remain covered or protected. The accessed coupons can then be used for testing unit processes for optimization. Techniques herein are non-destructive, that is, they do not generate particles from cleaving a wafer. Accordingly, sample inspection is enabled on sensitive metrology equipment that would typically be prohibited had standard coupon techniques been used. Using a direct write patterning system enables die-by-die unique processing which would be cost prohibitive using conventional mask-based lithography.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Semiconductor devices are fabricated using multiple unit process steps including but not limited to thin film deposition, lithography and etch. Each of these unit processes require optimization based on the materials used in their construction and the design/layout of the device. In one embodiment, the unit process may comprise a reactive ion etch (RIE). The parameters to be optimized may comprise, for example, a combination of process gases requiring down selection with respective flow rate, top/bottom plasma power, and total etch time, among others. All of these settings are a function of the pattern loading (density, geometry, et cetera). If careful evaluation of process parameters is not considered, then device yield will be significantly impacted.

Executing process optimization across several fundamental semiconductor equipment sets for each layer can be a daunting task, especially considering there are typically seventy layers or more in a device design. Certain HVM device designs may be contained in areas on the order of 20 mm×30 mm die and repeated across the entirety of a 300 mm wafer. The size of a die may vary, for example, may also be larger for a 150 mm wafer or 200 mm wafer. Note that with techniques herein, coupon regions can be created of any size and shape within a given wafer of different sizes.

To improve efficiency of unit process optimization, a common practice is to physically cleave a wafer into a subset of individual samples containing one die each (e.g., FIGS. 1A-1C). This sample can then be affixed to a carrier wafer (e.g., FIG. 1D) and processed through conventional semiconductor equipment. Such couponing enables the evaluation of many combinations of equipment settings/parameters to determine the best conditions for fabrication. This destructive coupon practice is illustrated in FIG. 1A. A wafer 100 containing multiple devices is physically damaged using a diamond scribe pen to separate into individual dies (FIGS. 1A and 1B). FIG. 1C shows individual coupons/dies available to be tested with different unit processes. FIG. 1D shows an individual coupon no attached to a carrier wafer 105 for processing in equipment.

Although enabling efficient process optimization, this destructive couponing has many disadvantages. It is known by person having ordinary skill in the art that semiconductor chips are very sensitive to contamination during their fabrication. It is for this reason that the devices are constructed in a clean room environment, many of which that have less than 100 particles that are less than 0.5 um in size for every 0.5 $m^3$ of space. The act of cleaving a wafer generates particles compromising a clean room environment. Manual handling of the cleaved sample also introduces a contamination hazard because the sample is exposed to the ambient environment and handling. Due to the inherently dirty nature of the conventional coupon process, this can lead to tool contamination and restricted run paths that limit post process inspection. Furthermore, the crude nature in which the samples are affixed to a carrier wafers can limit compatibility with sensitive metrology tooling.

Techniques herein, however, circumvent these prescribed limitations of destructive couponing by leveraging lithography to selectively pattern a wafer to define one or more coupon regions. Conventional techniques to define semiconductor patterns typically use an optical lithography system (steppers and scanner tools) using deep ultraviolet (DUV) electromagnetic radiation to create high resolution relief image patterns in a photosensitive resist material. These patterns can then be effectively employed as a template for selective deposition and etch processes in a layered fabrication scheme. The images realized in resist are projections of a master pattern on a photomask. The photomask is generally constructed of chromium and quartz which integrate to create opaque and transparent region that dictate the propagation of source radiation at the mask interface, defining a latent image as the light reaches/interacts with the resist material producing wafer level patterns upon development. However, the construction of a photomask is not trivial and can introduce significant costs and the pattern exposed with a certain mask is identical for all wafers processed using it as illustrated in FIG. 2A.

This application relates to a method of processing a substrate, more particularly to mask-less patterning techniques alternative to the aforementioned conventional techniques. Embodiments of the present application disclose a method of non-destructive coupon generation based on mask-less direct-write technology. In various embodiments, the direct-write lithographic techniques include but are not limited to electron beam lithography, plasmonic lithography, grating light valve lithography and digital light projection (DLP) patterning systems. In these direct-write systems, a design file is uploaded to a write engine that guides the exposure process to define patterns in sensitive material based upon a coordinate grid to drive the write head and/or exposure stage. A key advantage of these systems in accordance with various embodiments is that the patterns are not restricted by physical media and are instead digitally generated, meaning that, if desired, each wafer can contain unique data without the need of generating a new physical mask by altering information in the digital domain as illustrated in FIG. 2B. Mask-based lithography typically has a higher resolution than digital light projection (DLP) direct-write, but with pseudo coupon generation herein, resolution is not a concern.

By using direct-write technology in accordance with various embodiments of this disclosure, location-specific opening on a per-wafer, per-device basis can be digitally executed in photoresist with conventional coating/develop processes. By uncovering select regions of a wafer (e.g., one or more latent regions defined by a direct-write lithographic technique), a coupon is effectively created without physically deforming the wafer or manual handling. The direct write lithography process uses computer controlled optics to project an exposure pattern of radiation and is able to form a pattern of radiation directly from a computer-aided design (CAD) file (e.g., FIG. 2B).

In the following, process steps of non-destructive coupon generation are described referring to FIGS. 3A-3F and 4A-4C. Process flow diagrams in accordance with various embodiments are then described referring to FIGS. 5A-5E. An example process flow 50 illustrated in FIG. 5A is described below together with FIGS. 3A-3F and 4A-4C.

Figure 5A:
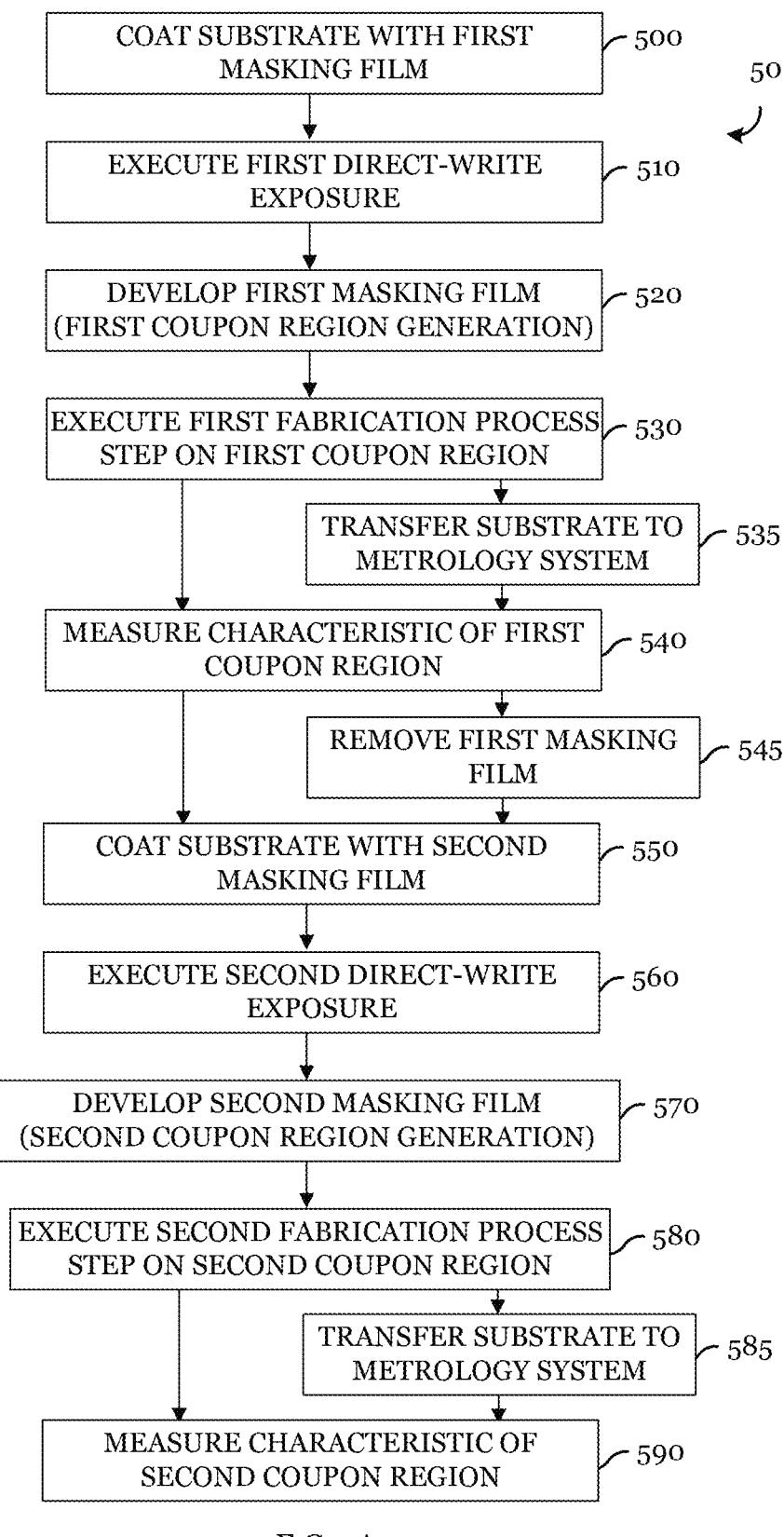

In FIG. 3A, a wafer 100 (like the wafer from FIG. 1A) is coated with a photosensitive material (e.g., block 500 in FIG. 5A). The wafer 100 comprises a semiconductor substrate in various embodiments. In one or more embodiments, the wafer 100 may be a silicon wafer, or a silicon-on-insulator (SOI) wafer. In certain embodiments, the wafer 100 may comprise a silicon germanium wafer, silicon carbide wafer, gallium arsenide wafer, gallium nitride wafer and other compound semiconductors. In other embodiments, the wafer 100 comprises heterogeneous layers such as silicon germanium on silicon, gallium nitride on silicon, silicon carbon on silicon, as well layers of silicon on a silicon or SOI substrate.

The wafer 100 may comprise multiple individual dies 110. In FIG. 3A, the wafer 100 has a 6×6 matrix of dies (a total of 36 dies). In various embodiments, the wafer 100 may comprise any number of dies, typically between several and dozens.

In various embodiments, the photosensitive material may comprise a first photoresist that reacts upon an exposure to an actinic radiation. The first photoresist may be a positive photoresist, a negative photoresist, or a hybrid tone photoresist, and may comprise a mixture of any suitable photosensitive materials. In one example, the first photoresist may comprises phenol formaldehyde resin or a diazo-naphtho-quinone (DNQ) based resin. In one or more embodiments, the first photoresist may comprise a chemically amplified resist. In another embodiment, the first photoresist may comprise a non-chemically amplified resist material such as polymethyl methacrylate (PMMA) or hydrogen silsesqui-oxane (HSQ). A photoresist layer 115 may be deposited over the wafer 100 from a solution by, for example, a conventional spin coating technique. In various embodiments, a soft bake process may be used to evaporate any residual solvent of the first photoresist and to densify the photoresist. The soft bake process includes heating the first photoresist within a narrow temperature range, e.g., between 75° C. and 100° C. The photoresist layer 115 may be patterned in subsequent steps below by direct-write lithography to define one or more coupon regions.

In certain embodiments, the photosensitive material may comprise an unconventional photoresist and may not require a development process based on wet chemistry, wherein a dry development process may be used instead. In one embodiments, such a dry development process may induce sublimation of exposed or unexposed regions of a photoresist with or without post processing measures (e.g., baking and/or curing).

The wafer 100 can have die regions or intended die regions which become coupon regions. As described above, couponing is to generate multiple test samples from a wafer. In a conventional destructive couponing method, a wafer is physically separated into individual coupons (i.e., dies). However, the embodiment method of this disclosure does not require cutting the wafer. Instead, the wafer is partitioned into different regions by masking. Therefore, in this disclosure, such an isolated region as a test sample, while still a part of the wafer, is referred to as "a coupon region" or "a pseudo coupon".

In FIG. 3B, a direct-write lithography tool 120 is illustrated. The direct-write lithography tool 120 is used to project a first pattern 130A to define a coupon region 150. A light source 140 is configured to generate an actinic radiation that may be projected onto the wafer. In certain embodiments, the light source 140 may comprise a tunable i-line digital light processing (DLP) source with a range of wavelength between 365 nm and 405 nm.

The direct-write lithography tool 120 may comprise a processor having a program configured to execute instructions for the non-destructive coupon generation process. The instructions to pattern the actinic radiation may be provided by a digital mask file, which may be uploaded to the direct-write lithography tool 120. In various embodiments, the digital mask file may be a (computer-aided design) CAD file. Further, the digital mask file may comprise a plurality of patterns for multiple cycles of the non-destructive coupon generation process. According to the digital mask file, the wafer 100 may be exposed to the actinic radiation to induce a photo-reaction in a portion of the photoresist layer 115 (FIG. 3B, block 510 in FIG. 5A). In one or more embodiments where the first photoresist is a positive photoresist, the portion of the first photoresist exposed to the actinic radiation becomes soluble to a solvent, such as developer fluid, while remaining unexposed portions of the first photoresist remain insoluble to the solvent. In alternate embodiments where the first photoresist is a negative photoresist, the portion of the first photoresist become insoluble or less soluble to a solvent, while remaining unexposed portions of the first photoresist are soluble in the solvent. By the direct-write lithography, the embodiment method selectively exposes only one (or a few) of the coupon regions on the wafer 100 without requiring a photomask.

After the exposure, a hard bake process may be performed to stabilize and harden the first photoresist. The hard bake process may be performed at a higher temperature than the soft bake process and, for example, performed between 100° C. and 150° C.

Subsequently, the photoresist layer 115 covering the wafer 100 may be developed using standard semiconductor practices resulting in the opening of a relative small coupon region area (e.g., the coupon region 150 in FIG. 3C) on the wafer 100 (e.g., block 520 in FIG. 5A). In one or more embodiments where a positive photoresist is used, the portion of the first photoresist exposed to the actinic radiation may be removed by exposing to a developer solution, which may comprise phenol-based strippers, acetone, trichloroethylene, and others. In alternate embodiments where a negative photoresist is used, the developer solution may comprise methyl ethyl ketone, methyl isobutyl ketone, and others.

Figure 3D:
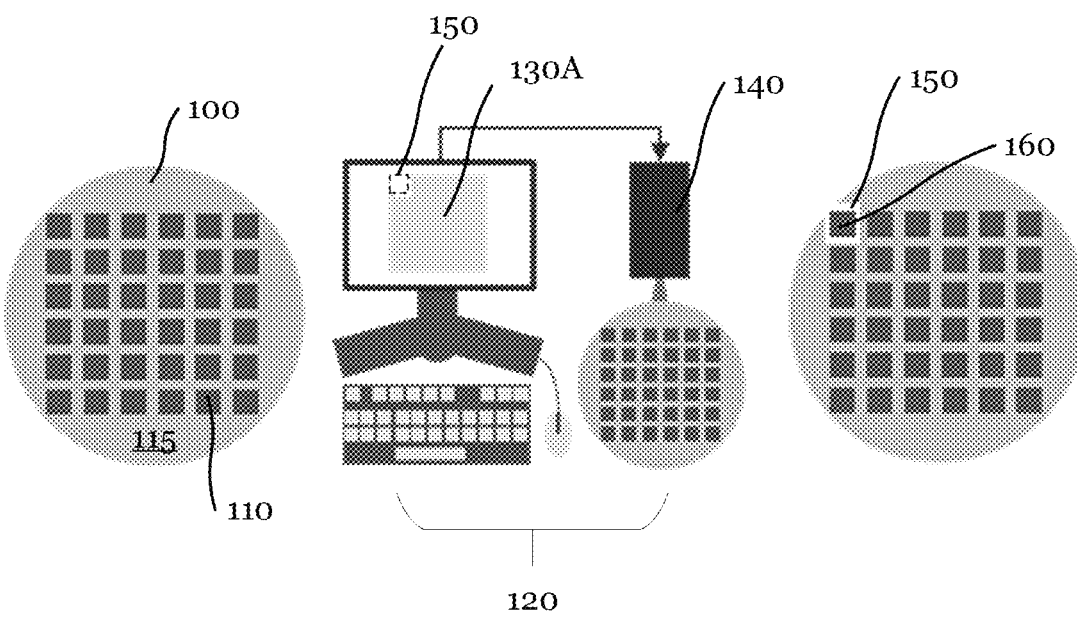
Figure 3D:
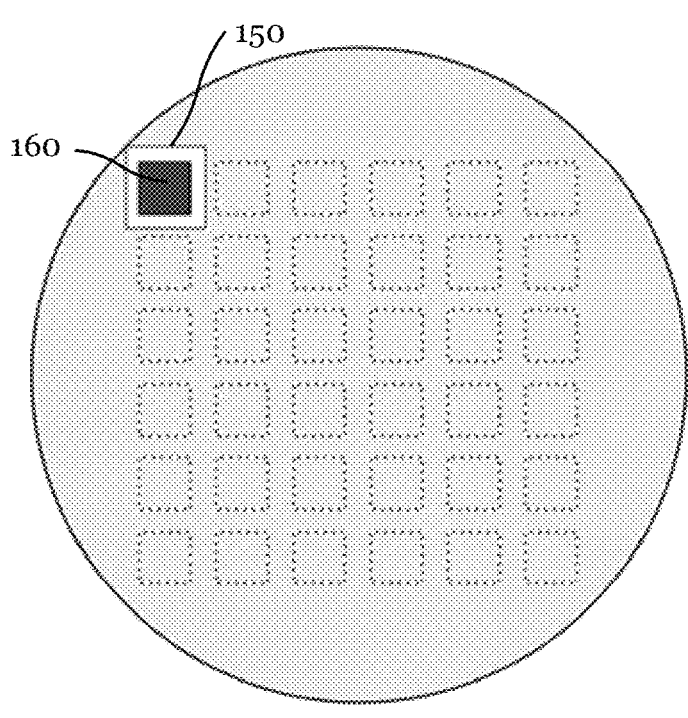

FIG. 3D is an enlarged illustration of the coupon region 150 in the same embodiment as illustrated in FIG. 3C opened for testing for subsequent process optimization. In the example embodiment, the coupon region 150 comprises one individual die 160 exposed, while the rest of dies (35 dies) is still preserved or protected by the photoresist layer 115. Such an embodiment may be preferred when maximizing the number of test samples (regions) available from one wafer. In other embodiments, on the other hand, a coupon region may comprise more than one individual die.

Figure 3E:
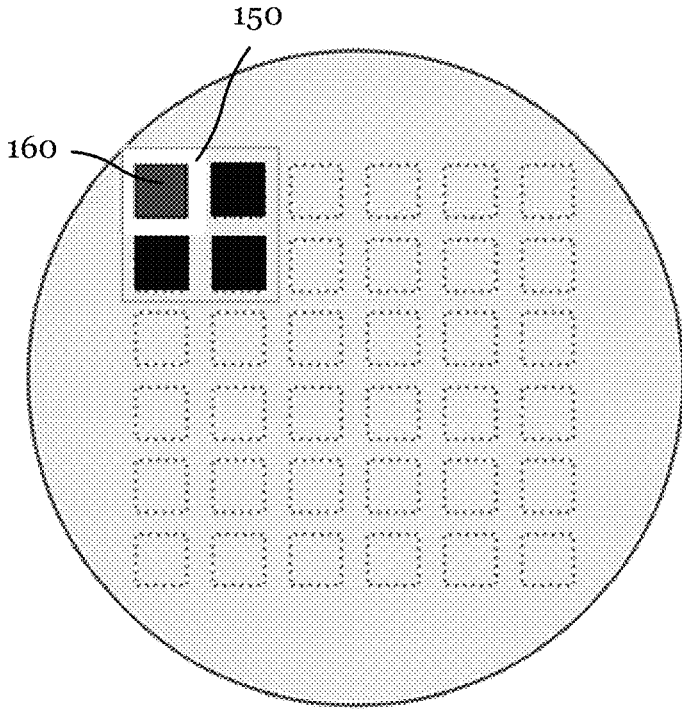
Figure 3F:
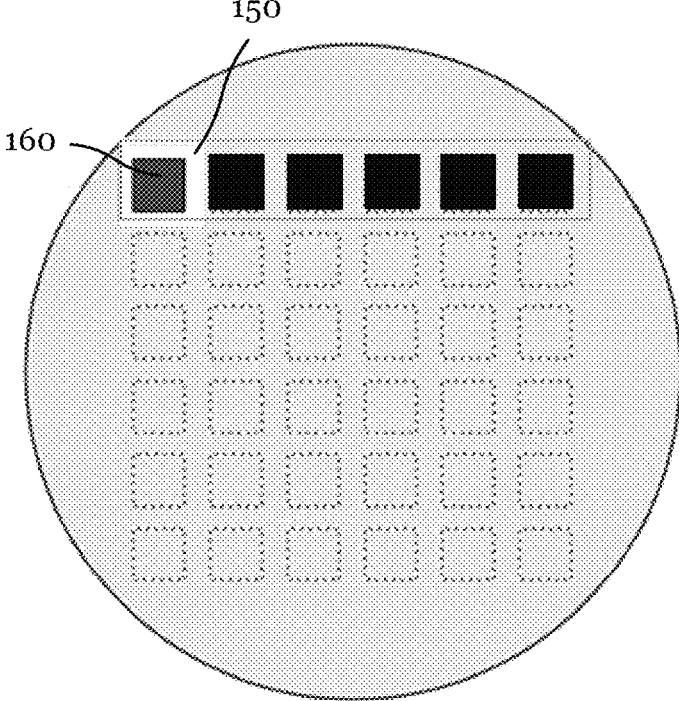

FIGS. 3E and 3F illustrate examples of a coupon region comprising a plurality of individual dies.

In these embodiments, a coupon region may comprise a plurality of individual dies (regions) separated with spacing. In one embodiment, a coupon region 150 may comprise a matrix of 2×2 individual dies 160 (FIG. 3E). In another embodiment, a coupon region 150 may comprise a line (1×6) of individual dies 160 (FIG. 3F). In other embodiments, several large coupon regions may be used to partition the wafer 100. For example, the wafer may be bisected or quartered with two or four coupon regions, respectively. Having multiple individual dies in one coupon may advantageously allow multiple measurement locations for a test sample that corresponds to a process condition of a fabrication process to be examined. Accordingly, these embodiments may enable better statistical analysis through averaging and/or investigating location dependency of the fabrication process. In the above example embodiments (FIGS. 3E and 3F), the individual dies 160 in the coupon region 150 are adjacent to each other. In alternate embodiments, however, it is possible for a coupon region to comprise individual dies that are separately located and not adjacent. For example, in one embodiment, a coupon region may comprise every other individual die of the wafer 100. In such an embodiment where an array of dispersed individual dies is selected for a coupon region, the uniformity of a fabrication process under a certain process condition may advantageously be investigated with a reduced time. A number and a size of coupon regions may be determined based on a number of process conditions to be examined and/or a number of dies available within a wafer.

After the coupon region is successfully prepared, the wafer 100 may be processed in a semiconductor fabrication process for process development purpose (e.g., block 530 in FIG. 5A). Various types of semiconductor fabrication process may be applied in accordance with different embodiments. Such semiconductor fabrication processes include various deposition processes such as chemical vapor deposition (CVD), physical vapor deposition (PVD), atomic layer deposition (ALD), as well as other plasma processes such as plasma enhanced CVD (PECVD). Similarly, the embodiment system may be applied to various etch processes such as wet etching, remote radical etching, non-plasma dry etching, reactive ion etch (RIE) process, and atomic layer etch (ALE) Further, the embodiment method may be applied to coating processes such as spin on coating for patterning photoresist, carbon hardmask materials and the like, and bottom-up polymer patterning for self-aligned monolayer (SAM) in gas or liquid phase. Photolithographic processes may also be performed as a semiconductor fabrication process in accordance with various embodiments. Other processes available for the embodiment method include but are not limited to processes based on wet chemistry, thermal processes such as rapid thermal annealing (RTA), furnace diffusion, oxidation, and implantation for doping. In various embodiments, the semiconductor fabrication process may be performed in a process vacuum chamber. In certain embodiments, the wafer 100 may be transferred to a separate process chamber for the semiconductor fabrication process.

After the fabrication process on the wafer, a characterization process may be performed by measuring one or more characteristics of the coupon region (e.g., block 540 in FIG. 5A). In certain embodiments, prior to the measuring, the wafer may be transferred to a metrology system (e.g., block 535 in FIG. 5A). Alternately, an in-situ measurement may be performed within the direct-write lithography tool equipped with a metrology tool, where transfer of the wafer may not be necessary. The characterization process may comprise spectroscopic analysis such as Fourier-transform infrared spectroscopy (FTIR) and ultraviolet-visible spectroscopy, microscopic analysis such as scanning electron microscopy, small angle x-ray scattering (SAXS), inline electrical probing, wafer optical scatterometry, bow metrology, or other techniques. In various embodiments, a process condition for the semiconductor fabrication process may be uniquely assigned to a coupon region, and the characteristic of the coupon region obtained by the characterization process may be correlated with the unique process condition assigned. This process enables a process development and helps generating a baseline process recipe for the semiconductor fabrication process.

As can be appreciated, a given wafer can have an array of non-destructive coupon regions for testing incremental processes. Each region in an array, for example, can be stepwise uncovered, processed, and then covered while a subsequent region is uncovered for processing. The process of non-destructive coupon generation and measurement (e.g., blocks 500-540 in FIG. 5A) can be repeated any number of times in accordance with various embodiments.

Figures 4A, 4B, 4C:
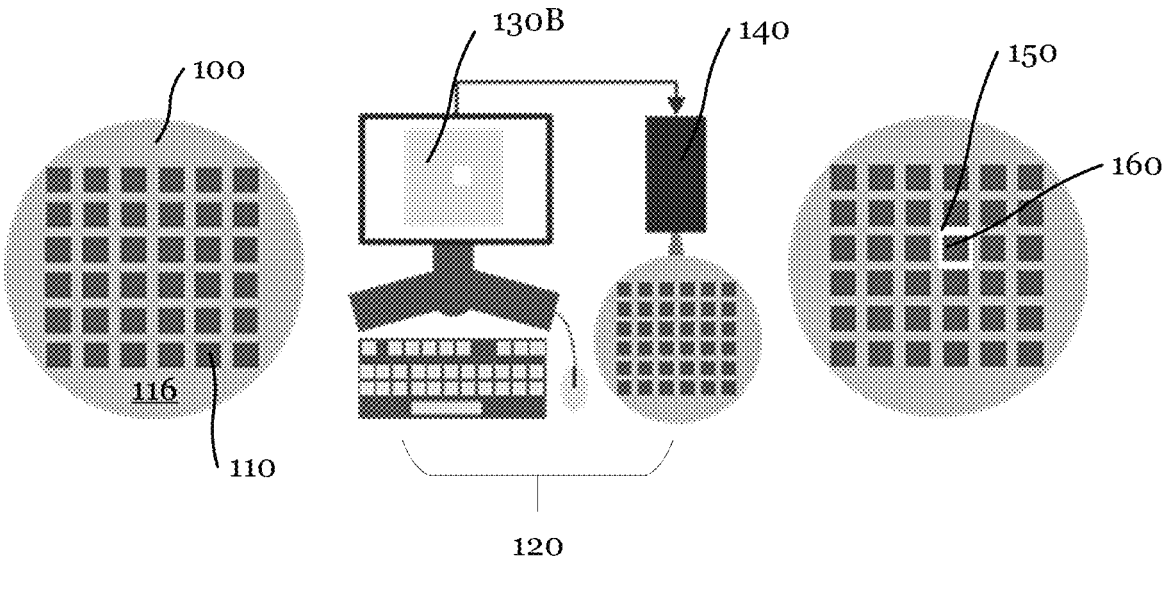

FIGS. 4A-4C illustrate process steps of a subsequent direct-write lithographic process of non-destructive coupon generation as a second cycle of the process, corresponding blocks 545-590 in FIG. 5A.

In one embodiment, the process may be continued by stripping the couponed photoresist (e.g., block 545 in FIG. 5A), reapplying a fresh photosensitive film (e.g., block 550 in FIG. 5A) and manipulating the pattern data in the digital domain for a second direct-write lithography. In certain embodiments, the removal of the couponed photoresist from the first cycle may be skipped.

In FIG. 4A, a wafer 100 is re-coated with a second photoresist to form a second photoresist layer 116 (e.g., block 550 in FIG. 5A). In various embodiments, the second photoresist may have a same chemical composition as the first photoresist, but may have a different chemical composition in other embodiments.

In FIG. 4B, the direct-write lithography tool 120 has a design for a second pattern 130B. The second pattern 130B may be uploaded by a second digital mask file, or the first digital mask file may comprise a plurality of patterns including the pattern for a second cycle of non-destructive coupon generation (e.g., the pattern 130B in FIG. 4B). Accordingly, a second direct-write lithographic process may be performed (e.g., block 560 in FIG. 5A).

After the exposure, the photoresist layer 116 covering the wafer 100 may be developed using standard semiconductor practices resulting in a second coupon region (e.g., block 570 in FIG. 5A). In FIG. 4C, a resulting coupon region 150 on the wafer 100 is illustrated. As illustrated, a new region has been opened up at a location different from the first coupon region (e.g., the coupon region 150 in FIGS. 3C and 3D), making the new region available for another fabrication process for process development purpose.

After the second coupon region is successfully prepared, the wafer 100 may be processed in a second semiconductor fabrication process for process development purpose (e.g., block 580 in FIG. 5A). In various embodiment, the second semiconductor fabrication process may be the same process as the first cycle of non-destructive coupon generation (e.g., block 530 in FIG. 5A), but may be under a different process condition. These embodiments may be particularly useful for identifying an optimal process condition of the semiconductor fabrication process. In other embodiments, the second semiconductor fabrication may be a different type of fabrication from the first semiconductor fabrication. Yet in alternate embodiments, the second semiconductor fabrication may be a series of processes including the first semiconductor fabrication. For example, the first semiconductor fabrication may comprise a RIE process and the second semiconductor fabrication process may comprise the RIE process and a wet chemical process.

After the fabrication process on the wafer, a second characterization process may be performed by measuring one or more characteristics of the coupon region (e.g., block 590 in FIG. 5A). In certain embodiments, prior to the measuring, the wafer may be transferred to a metrology system (e.g., block 585 in FIG. 5A).

FIGS. 5B-5E illustrate process flow diagrams of non-destructive coupon generation in accordance with alternate embodiments.

Figure 5B:
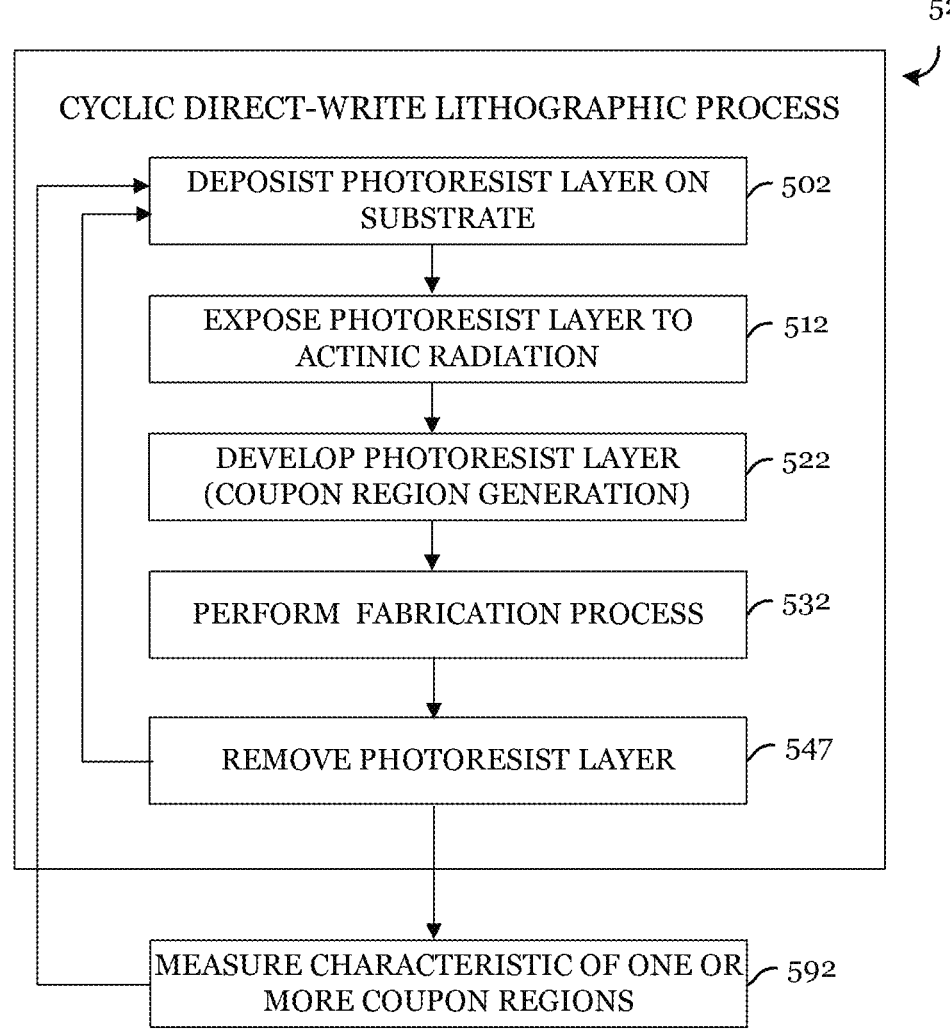

In FIG. 5B, a non-destructive coupon generation process may comprise a cyclic direct-write lithographic process 52. One cycle of the cyclic direct-write lithographic process 52 comprises depositing a photoresist layer on a wafer (block 502), exposing the photoresist layer to an actinic radiation with a pattern using a direct-write lithography tool (block 512), developing the photoresist layer to generate a coupon region (block 522), performing a fabrication process on the coupon region (block 532), and removing the photoresist layer (block 547). This series of steps (blocks 502, 512, 522, 532, and 547) may be repeated for any number of times to generate multiple coupon regions that are processed by different fabrication conditions and/or processes. As illustrated, in one embodiment, after a certain number of cycles, one or more characteristics of the coupon regions may be measured in a characterization process (block 592). For example, the characterization process may be performed after completing all planned cycles of the steps (blocks 502, 512, 522, 532, and 547). In other embodiments, the characterization process may be performed in each cycle or a selected group of cycles.

Note that for some fabrication processes, a photoresist mask might not be compatible. Alternatively, in certain embodiments, the patterned photoresist can be transferred into an intermediate layer to serve as the protective film. FIG. 5C illustrates a process flow diagram 53 in accordance with such an embodiment.

In FIG. 5C, unlike previous embodiments, an intermediate layer may be first deposited over the wafer (block 501). For example a layer of silicon oxide or silicon nitride can be deposited on the wafer. Any other suitable materials such as silicon-based dielectric and metal oxides may be used. The deposition of the intermediate layer may be performed using deposition processes such as chemical vapor deposition (CVD), physical vapor deposition (PVD), atomic layer deposition (ALD), as well as other plasma processes such as plasma enhanced CVD (PECVD) in accordance with various embodiments. Next, a photoresist layer may be formed over the intermediate layer (block 502). Then direct-write photolithography can be used to uncover a particular coupon region. First, the photoresist layer is exposed to an actinic radiation (block 512) with a pattern and then the photoresist layer may be developed (block 522), opening up the coupon region and exposing a portion of the intermediate layer below the photoresist layer. Subsequently, an etch process may be performed to etch away the underlying protective film (i.e., the intermediate layer) to uncover a coupon region for testing (block 523). In this step, the patterned photoresist can function as an etch mask. The etch process may be performed using various etch processes such as wet etching, remote radical etching, non-plasma dry etching, reactive ion etch (RIE) process, and atomic layer etch (ALE) The remaining photoresist layer can be removed by ashing or otherwise after the etch process. Accordingly, the coupon region is defined by the opening in the patterned intermediate layer on the wafer, instead of the photoresist layer. Subsequent steps, similar to previous embodiments, may be performing a fabrication process (block 532), followed by removing the intermediate layer (block 548). This series of steps (blocks 501, 502, 512, 522, 523, 532, and 548) may be repeated for any number of times to generate multiple coupon regions for different fabrication processes. As illustrated, in one embodiment, after a certain number of cycles, one or more characteristics of the coupon regions may be measured in a characterization process (block 592). In other embodiments, the characterization process may be performed in each cycle or a selected group of cycles.

Figure 5D:
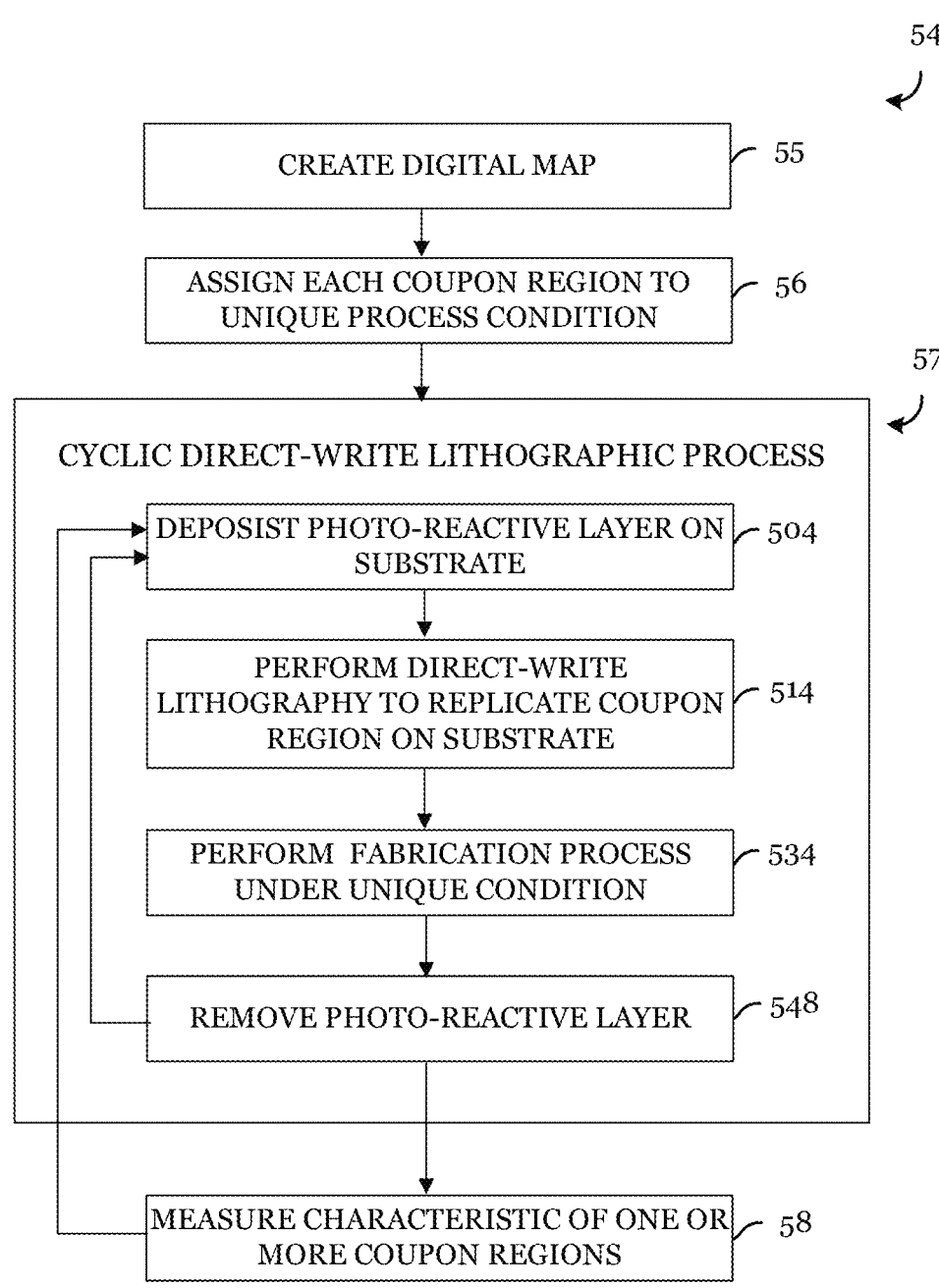

In FIG. 5D, a process flow diagram 54 illustrates a method of generating a baseline process recipe for a semiconductor fabrication process in accordance with an embodiment. First, a digital map that partitions a portion of a wafer into a plurality of coupon regions is generated (block 55). The digital map may be created as a computer-aided design (CAD) file. Next, each coupon region designed in the digital map may be assigned to a unique process condition of the semiconductor fabrication process to be developed (block 56). These steps of generating the digital map and the assigning may be performed on a computer equipped with a direct-write lithography tool. Subsequently, a cyclic direct-write lithographic process 57 may be performed. Each cycle of the cyclic direct-write lithographic process 57 may comprise depositing a photoresist layer over the wafer (block 504), replicating one of the plurality of coupon regions on the wafer by direct-write lithography according to the digital map (block 514), performing the fabrication process under the unique process condition assigned to the one of the plurality of coupon regions (block 534), and removing the photoresist layer (block 548). This series of steps (blocks 504, 514, 534, and 548) may be repeated for any number of times to generate multiple coupon regions for different fabrication processes. As illustrated, in one embodiment, after a certain number of cycles, one or more characteristics of the coupon regions may be measured in a characterization process (block 58). In other embodiments, the characterization process may be performed in each cycle or a selected group of cycles.

In process development, the process flow described above and illustrated in FIG. 5D may be used to generate the baseline process recipe for the fabrication process. For example, the semiconductor fabrication process may be a reactive ion etch (RIE), and process conditions may comprise types of process gases, gas flow rates, top/bottom plasma power, and total etch time. A critical dimension (CD) of a feature fabricated by the RIE process on the coupon region may be measured as the characteristic of interest. The baseline process recipe for the RIE process may be determined by correlating the measured CD and unique process conditions assigned to each coupon region, and by identifying an ideal process condition. Accordingly, a plurality of wafers may be processed in accordance with the generated baseline process recipe.

Figure 5E:
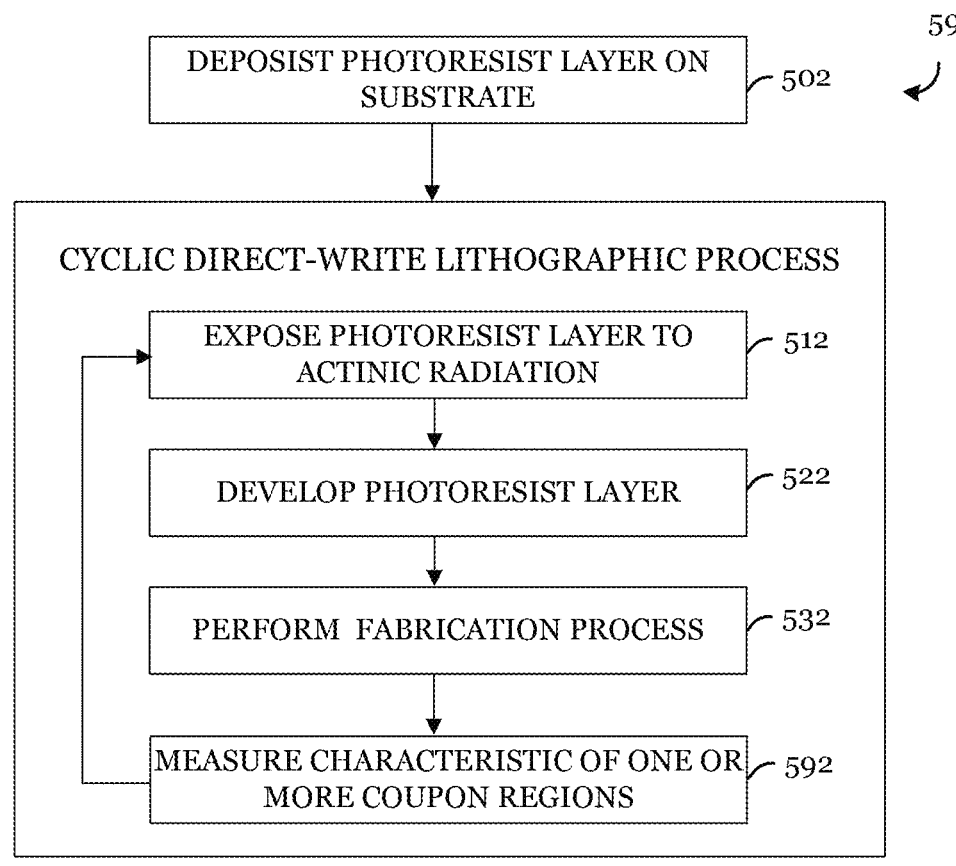

In FIG. 5E, a process flow diagram 59 illustrates alternate embodiment, where depositing a photoresist layer may be performed only once. Accordingly, the non-destructive coupon generation process may not require removing a photoresist or reapplying a new photoresist. For example, a positive tone photoresist may be first applied (block 502) before a cyclic direct-write lithographic process. The first coupon region may then be generated by exposing the photoresist layer to an actinic radiation with a pattern using a direct-write lithography tool (block 512), followed by developing the photoresist layer (block 522). Next, a fabrication process on the first coupon region may be performed (block 532), followed by a characterization process (block 592). Without removing the remaining photoresist layer or adding another layer, a second coupon region may be opened by starting another cycle of the direct-write lithographic process, processed and measured (blocks 512, 522, 532, and 592). Further, in certain embodiments, as described above, a non-standard photoresist that may not require a development process based on wet chemistry may also be contemplated. Instead of a wet development process, a dry development process to remove the reacted photoresist may be used with or without baking/curing steps.

Various embodiments described above may be performed using a non-destructive coupon hardware system. The non-destructive coupon hardware system may comprise a track configured to support a substrate during a deposition or developing process. The track may be coupled to a direct write lithography tool and one or more microprocessors configured to execute programs to perform the steps described above in accordance with various embodiments.

As described above with various embodiments, using direct-write lithography eliminates the cost, complexity and burden of physical mask overhead because the wafer pattern data is stored the digital domain. Using direct write lithography to create coupons that do not rely on physical destruction of the wafer avoids the contamination and metrology tool inspection limitations of conventional couponing techniques used in the semiconductor industry. Additionally, preserving the full wafer streamlines metrology inspection such that traditional recipe generation can be used rather than manual inspection on a coupon-by-coupon basis.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Example embodiments of the invention are summarized here. Other embodiments can also be understood from the entirety of the specification as well as the claims filed herein.

Example 1

A method of processing a substrate, the method including: coating a substrate with a first masking film including a first photoresist; executing a first direct-write exposure process of a first patterned actinic radiation on the first masking film, the first patterned actinic radiation creating a first latent pattern that defines a first coupon region on the substrate; developing the first masking film resulting in a first topographic masking film with the first coupon region uncovered; executing a first fabrication process step on the first coupon region; measuring a characteristic of the first coupon region; coating the substrate with a second masking film including a second photoresist; executing a second direct-write exposure process of a second patterned actinic radiation on the second masking film, the second patterned actinic radiation creating a second latent pattern that defines a second coupon region on the substrate; developing the second masking film resulting in a second topographic masking film with the second coupon region uncovered; executing a second fabrication process step on the second coupon region; and measuring a characteristic of the second coupon region.

Example 2

The method of example 1, further including transferring the substrate to a metrology system configured for measuring the characteristic of the first coupon region, the second coupon region, or both.

Example 3

The method of one of examples 1 or 2, further including before coating the substrate with the second masking film, removing the first masking film.

Example 4

The method of one of examples 1 to 3, where the first coupon region and the second coupon region are at different locations on the substrate, and where the first fabrication process and the second fabrication process are a same process but are performed under different process conditions.

Example 5

The method of one of examples 1 to 4, where the first coupon region and the second coupon region are at different locations on the substrate, and where the first fabrication process and the second fabrication process are two different semiconductor fabrication processes.

Example 6

The method of one of examples 1 to 4, where the first coupon region and the second coupon region are at different locations on the substrate, and where the second fabrication process includes the first fabrication process and an additional fabrication process.

Example 7

The method of one of examples 1 to 6, where the first patterned actinic radiation is patterned by a digital image projection system according to a digital mask file and not using a physical photomask.

Example 8

A method of processing a substrate that includes: depositing a photoresist layer over the substrate; performing a cyclic direct-write lithographic process using a direct-write lithography tool, the cyclic direct-write lithographic process including a plurality of cycles, each of the plurality of cycles including: exposing the photoresist layer to a patterned actinic radiation without using a photomask, defining one of a plurality of coupon regions, where the plurality of coupon regions are configured to generate a plurality of test samples on the substrate for evaluating process conditions of a fabrication process; exposing the one of the plurality of coupon regions; and performing the fabrication process on the one of the plurality of coupon regions.

Example 9

The method of example 8, further including measuring a characteristic of one of the plurality of coupon regions.

Example 10

The method of one of examples 8 or 9, where exposing the one of the plurality of coupon regions is performed by developing the photoresist layer.

Example 11

The method of one of examples 8 to 10, where each of the plurality of cycles further includes: after performing the fabrication process, removing the photoresist layer and reapplying a new photoresist layer.

Example 12

The method of one of examples 8 to 9, further including: before depositing the photoresist layer, depositing a protective layer over the substrate; and after developing the photoresist layer, performing an etch process to remove the protective layer within the one of the plurality of coupon regions and to expose the one of the plurality of coupon regions, the remaining photoresist layer serving as an etch mask.

Example 13

The method of example 12, where the protective layer includes silicon oxide or silicon nitride.

Example 14

The method of one of examples 8 to 13, where each of the plurality of cycles further includes uploading a digital mask file to the direct-write lithography tool, the digital mask file contains information of a pattern for generating the patterned actinic radiation.

Example 15

The method of one of examples 8 to 14, where each of the plurality of cycles further includes changing a parameter of the fabrication process from a previous cycle.

Example 16

The method of one of examples 8 to 15, where the substrate includes a plurality of dies and each of the plurality of coupon regions includes a die.

Example 17

The method of one of examples 8 to 16, further including generating a baseline process recipe for the fabrication process based on characteristics of the plurality of coupon regions.

Example 18

The method of one of examples 8 to 17, further including determining a number and a size of coupon regions based on a number of process conditions to be examined or a number of dies available within the substrate.

Example 19

A non-destructive coupon hardware system including: a track configured to support a substrate during a deposition or developing process, the track being coupled to a direct write lithography tool; and one or more microprocessors configured to execute programs to: create a digital map that partitions a portion of the substrate into a plurality of coupon regions, deposit a photoresist layer over the substrate supported on the track, expose the photoresist layer on the track based on the digital map using the direct write lithography tool, and develop the exposed photoresist layer to open a coupon region for further processing.

Example 20

The non-destructive coupon hardware system of one of examples 19, where the one or more microprocessors are further configured to execute programs to: transfer the substrate to a metrology system; measure a characteristic of the coupon region; and generate a baseline process recipe for the fabrication process for processing a plurality of wafers based on the measuring.

Example 21

A method of generating a baseline process recipe for a fabrication process including: creating a digital map that partitions a portion of a substrate into a plurality of coupon regions; assigning each of the plurality of coupon regions to a unique process condition of the fabrication process; performing a cyclic lithography process, each cycle including: depositing a photoresist layer over the substrate; replicating one of the plurality of coupon regions on the substrate by direct-write lithography according to the digital map; performing the fabrication process under the unique process condition assigned to the one of the plurality of coupon regions; and removing the photoresist layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

coating the substrate with a first masking film comprising a first photoresist, the substrate comprising a plurality of dies;

executing a first direct-write exposure process of a first patterned actinic radiation on the first masking film, the first patterned actinic radiation creating a first latent pattern that defines a first coupon region on the substrate, the first coupon region comprising first dies of the plurality of dies, entireties of the first dies being within a first perimeter of the first coupon region, entirety of the first perimeter being within a scribe region of the substrate, the first dies being arranged in a first matrix, wherein the first coupon region extends from a first portion of an edge of the substrate to a second portion of the edge of the substrate, and wherein the first portion of the edge of the substrate is spaced apart from the second portion of the edge of the substrate;

developing the first masking film resulting in a first topographic masking film with the first coupon region uncovered;

executing a first fabrication process on the first coupon region;

measuring a characteristic of the first coupon region;

coating the substrate with a second masking film comprising a second photoresist;

executing a second direct-write exposure process of a second patterned actinic radiation on the second masking film, the second patterned actinic radiation creating a second latent pattern that defines a second coupon region on the substrate, the second coupon region comprising second dies of the plurality of dies, entireties of the second dies being within a second perimeter of the second coupon region, the second dies being different from the first dies, entirety of the second perimeter being within the scribe region of the substrate, the second dies being arranged in a second matrix;

developing the second masking film resulting in a second topographic masking film with the second coupon region uncovered;

executing a second fabrication process on the second coupon region; and measuring a characteristic of the second coupon region.

2. The method of claim 1, further comprising transferring the substrate to a metrology system configured for measuring the characteristic of the first coupon region, the second coupon region, or both.

3. The method of claim 2, further comprising before coating the substrate with the second masking film, removing the first masking film.

4. The method of claim 1, wherein the first coupon region and the second coupon region are at different locations on the substrate, and wherein the first fabrication process and the second fabrication process are a same process but are performed under different process conditions.

5. The method of claim 1, wherein the first coupon region and the second coupon region are at different locations on the substrate, and wherein the first fabrication process and the second fabrication process are two different semiconductor fabrication processes.

6. The method of claim 1, wherein the first coupon region and the second coupon region are at different locations on the substrate, and wherein the second fabrication process comprises the first fabrication process and an additional fabrication process.

7. The method of claim 1, wherein the first patterned actinic radiation is patterned by a digital image projection system according to a digital mask file and not using a physical photomask.

8. A method of processing a substrate, the method comprising:

depositing a photoresist layer over the substrate, wherein the substrate comprises a plurality of dies; and performing a cyclic direct-write lithographic process using a direct-write lithography tool, the cyclic direct-write lithographic process comprising a plurality of cycles, each of the plurality of cycles comprising:

exposing the photoresist layer to a patterned actinic radiation without using a photomask, defining one of a plurality of coupon regions, wherein each of the plurality of coupon regions comprises an entire die of the plurality of dies, wherein a first coupon region of the plurality of coupon regions extends from a first portion of an edge of the substrate to a second portion of the edge of the substrate, wherein the first portion of the edge of the substrate is spaced apart from the second portion of the edge of the substrate, and wherein the plurality of coupon regions are configured to generate a plurality of test samples on the substrate for evaluating process conditions of a fabrication process;

revealing the one of the plurality of coupon regions; and performing the fabrication process on the one of the plurality of coupon regions.

9. The method of claim 8, further comprising measuring a characteristic of the one of the plurality of coupon regions.

10. The method of claim 8, wherein revealing the one of the plurality of coupon regions is performed by developing the photoresist layer.

11. The method of claim 8, wherein each of the plurality of cycles further comprises:

after performing the fabrication process, removing the photoresist layer and reapplying a new photoresist layer.

12. The method of claim 8, further comprising:

before depositing the photoresist layer, depositing a protective layer over the substrate; and after developing the photoresist layer, performing an etch process to remove the protective layer within the one of the plurality of coupon regions and to expose the one of the plurality of coupon regions, the remaining photoresist layer serving as an etch mask.

13. The method of claim 12, wherein the protective layer comprises silicon oxide or silicon nitride.

14. The method of claim 8, wherein each of the plurality of cycles further comprises uploading a digital mask file to the direct-write lithography tool, the digital mask file contains information of a pattern for generating the patterned actinic radiation.

15. The method of claim 8, wherein each of the plurality of cycles further comprises changing a parameter of the fabrication process from a previous cycle.

16. The method of claim 8, further comprising generating a baseline process recipe for the fabrication process based on characteristics of the plurality of coupon regions.

17. The method of claim 8, further comprising determining a number and a size of coupon regions based on a number of process conditions to be examined or a number of dies available within the substrate.

18. A method of processing a substrate, the method comprising:

coating the substrate with a first masking film, the substrate comprising a plurality of dies;

patterning the first masking film using a first direct-write exposure process to reveal a first coupon region on the substrate, the first coupon region comprising first dies of the plurality of dies, entireties of the first dies being within a first perimeter of the first coupon region, entirety of the first perimeter being within a scribe region of the substrate, wherein the first dies are arranged in a first line, wherein the first coupon region extends from a first portion of an edge of the substrate to a second portion of the edge of the substrate, and wherein the first portion of the edge of the substrate is spaced apart from the second portion of the edge of the substrate;

performing a first fabrication process on the first coupon region;

removing the first masking film;

coating the substrate with a second masking film;

patterning the second masking film using a second direct-write exposure process to reveal a second coupon region on the substrate, the second coupon region comprising second dies of the plurality of dies, entireties of the second dies being within a second perimeter of the second coupon region, entirety of the second perimeter being within the scribe region of the substrate, wherein the second dies are arranged in a second line; and performing a second fabrication process on the second coupon region.

19. The method of claim 18, further comprising measuring a first characteristic of the first coupon region and a second characteristic of the second coupon region.

20. The method of claim 18, wherein the first dies are different from the second dies.

\* \* \* \* \*